(12) United States Patent
Noble, Jr. et al.

(10) Patent No.: US 6,503,790 B2
(45) Date of Patent: Jan. 7, 2003

(54) HIGH DENSITY VERTICAL SRAM CELL USING BIPOLAR LATCHUP INDUCED BY GATED DIODE BREAKDOWN

(75) Inventors: Wendell P. Noble, Jr., Milton, VT (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/871,682

(22) Filed: Jun. 4, 2001

(65) Prior Publication Data

US 2001/0024841 A1 Sep. 27, 2001

Related U.S. Application Data

(62) Division of application No. 09/076,487, filed on May 13, 1998.

(51) Int. Cl.[7] .......................................... H01L 21/8244
(52) U.S. Cl. ........................................ 438/237; 438/238
(58) Field of Search ................................ 438/237, 238

(56) References Cited

U.S. PATENT DOCUMENTS

| | | |
|---|---|---|
| 4,882,706 A | 11/1989 | Sinclair |
| 5,173,754 A | 12/1992 | Manning |
| 5,214,295 A | 5/1993 | Manning |
| 5,286,663 A | 2/1994 | Manning |
| 5,486,717 A | 1/1996 | Kokubo et al. |
| 5,497,011 A | 3/1996 | Terashima |
| 5,535,156 A | 7/1996 | Levy et al. |
| 5,581,104 A | 12/1996 | Lowrey et al. |
| 5,594,683 A | 1/1997 | Chen et al. |
| 5,600,160 A * | 2/1997 | Hvistendahl ............. 257/107 |
| 5,615,143 A | 3/1997 | MacDonald et al. |
| 5,624,863 A | 4/1997 | Helm et al. |
| 5,650,350 A | 7/1997 | Dennison et al. |
| 5,684,737 A | 11/1997 | Wang et al. |
| 5,705,843 A | 1/1998 | Roberts |
| 5,710,741 A | 1/1998 | McLaury |

OTHER PUBLICATIONS

Dermot MacSweeney et al., Modeling of Lateral Bipolar Devices in a CMOS, IEEE BCTM 1.4, 4 pages.
*J.J. Ebers, Four–Therminal P–N–P–N Transistors, Proceedings of IRE, Nov. 1952, p. 1361–4.
*I.T. Ho et al, Single Thyristor Static Memory and its Fabrication, vol. 23, No. 3, 1980.
*B.L. Gregory et al, Latchup in CMOS Integrated Circuits, Sandia Laboratories, p. 12–18.
*S.M. Sze, Physics of Semiconductor Devices, Second Edition, A Wiley Interscience Pub.
*S.D. Malaviya, Single Device DC Stable Memory Cell, IBM Technical Disclosure Bulletin, vol. 20, No. 9, pp. 3492–94, Nov. 1978.
*D.L. Hetherington et al, Anintegrated GaAs N–P–N–P Thyristor/JET Memory Cell Exhibiting Nondestructive Read, IEEE Electron Device Letters, vol. 13, No. 9, Sep. 1992.
*S.V. Vandebroek et al, High–gain Lateral Bipolar Action in a MOSFET Structure, IEEE Transactions on Electron Devices, vol. 38, No. 11, Nov. 1991.

* cited by examiner

*Primary Examiner*—Jey Tsai
(74) *Attorney, Agent, or Firm*—Dickstein Shapiro Morin & Oshinsky

(57) ABSTRACT

Area efficient static memory cells and arrays containing p-n-p-n transistors which can be latched in a bistable on state. Each transistor memory cell includes a gate which is pulse biased during the write operation to latch the cell. Also provided is a CMOS fabrication process to create the cells and arrays.

17 Claims, 9 Drawing Sheets

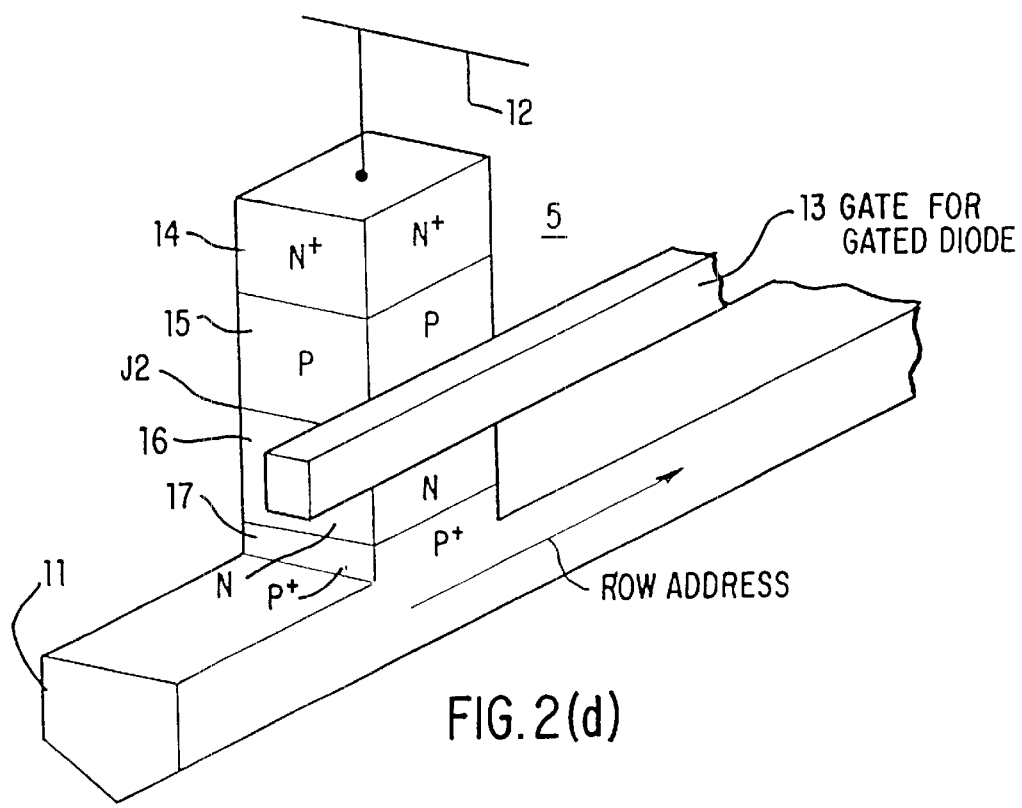
FIG.2(d)
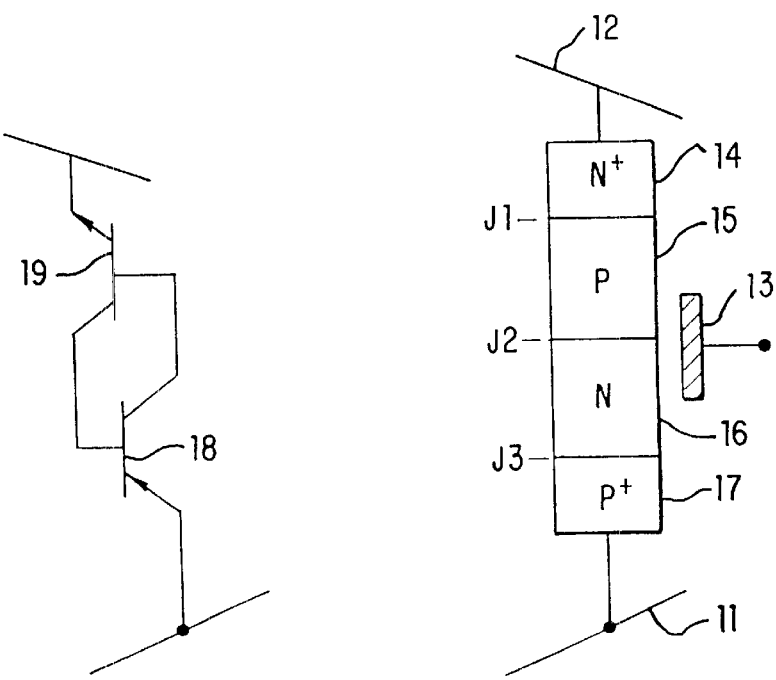
FIG.2(e)
FIG.2(f)

HIGH DENSITY VERTICAL SRAM CELL USING BIPOLAR LATCHUP INDUCED BY GATED DIODE BREAKDOWN

This patent application is a divisional application of U.S. patent application Ser. No. 09/076,487, filed on May 13, 1998, entitled HIGH DENSITY VERTICAL SRAM CELL USING BIPOLAR LATCHUP INDUCED BY GATED DIODE BREAKDOWN.

FIELD OF THE INVENTION

This invention relates generally to non-volatile static memory devices. Particularly, this invention relates to a high density Static Random-Access Memory (SRAM) cell taking advantage of the latch-up phenomenon in a Complementary Metal Oxide Semiconductor (CMOS).

BACKGROUND OF THE INVENTION

One known type of static read/write memory cell is a high-density static random access memory (SRAM). A static memory cell is characterized by operation in one of two mutually-exclusive and self-maintaining operating states. Each operating state defines one of the two possible binary bit values, zero or one. A static memory cell typically has an output which reflects the operating state of the memory cell. Such an output produces a "high" voltage to indicate a "set" operating state. The memory cell output produces a "low" voltage to indicate a "reset" operating state. A low or reset output voltage usually represents a binary value of zero, while a high or set output voltage represents a binary value of one.

A static memory cell is said to be bistable because it has two stable or self-maintaining operating states, corresponding to two different output voltages. Without external stimuli, a static memory cell will operate continuously in a single one of its two operating states. It has internal feedback to maintain a stable output voltage, corresponding to the operating state of the memory cell, as long as the memory cell receives power.

The operation of a static memory cell is in contrast to other types of memory cells such as dynamic cells which do not have stable operating states. A dynamic memory cell can be programmed to store a voltage which represents one of two binary values, but requires periodic reprogramming or "refreshing" to maintain this voltage for more than very short time periods.

A dynamic memory cell has no internal feedback to maintain a stable output voltage. Without refreshing, the output of a dynamic memory cell will drift toward intermediate or indeterminate voltages, resulting in loss of data. Dynamic memory cells are used in spite of this limitation because of the significantly greater packaging densities which can be attained. For instance, a dynamic memory cell can be fabricated with a single MOSFET transistor, rather than the six transistors typically required in a static memory cell.

One of the limitations of static memory cells utilizing both n-channel and p-channel devices (CMOS SRAMS) is their exceptionally large cell areas, typically over 100 $F^2$, where F is the minimum feature size. Even using only n-channel devices, cell size in a compact SRAM design is over 50 $F^2$. See U.S. Pat. No. 5,486,717. The result is much lower densities than for DRAMs, where the cell size is only 6 or 8 $F^2$.

Conventional CMOS SRAM cells essentially consist of a pair of cross-coupled inverters as the storage flip-flop or latch, and a pair of pass transistors as the access devices for data transfer into and out of the cell. Thus, a total of six Metal Oxide Semiconductor Field Effect Transistors (MOSFETs), or four MOSFETs plus two very high resistance load devices, are required for implementing a conventional CMOS SRAM cell.

To achieve higher packing densities, several methods are known for reducing the number of devices needed for CMOS SRAM cell implementation, or the number of the devices needed for performing the Read and Write operations. However, increased process complexity, extra masks, and high fabrication cost are required and the corresponding product yield is not high.

For example, K. Sakui, et al., "A new static memory cell based on reverse base current (RBC) effect of bipolar transistor," IEEE *IEDM Tech. Dig.*, pp. 44–47, December 1988), refers to a Bipolar-CMOS (BICMOS) process in which only two devices are needed for a SRAM cell: one vertical bipolar transistor, and one MOSFET as a pass device. Extra processing steps and increased masks are required, along with special deep isolation techniques, resulting in high fabrication cost and process complexity. Yield of SRAM products utilizing such complex processes is usually low compared with the existing CMOS processes.

A problem with CMOS circuits in general is their propensity to "latchup." Latchup is a phenomenon that establishes a very low-resistance path between the $V_{DD}$ and $V_{SS}$ power lines, allowing large currents to flow through the circuit. This can cause the circuit to cease functioning, or even to destroy itself due to heat damage caused by high power dissipation.

The susceptibility to latchup arises from the presence of complementary parasitic bipolar transistor structures, which result from the fabrication of the complementary MOS devices in CMOS structures. Since they are in close proximity to one another, the complementary bipolar structures can interact electrically to form device structures which behave like p-n-p-n diodes. In the absence of triggering currents, such diodes act as reverse-biased junctions and do not conduct. Such triggering currents, however, may be and in practice are established in any one or more of a variety of ways, e.g., terminal overvoltage stress, transient displacement currents, ionizing radiation, or impact ionization by hot electrons.

Gregory, B. L., et al., "Latchup in CMOS integrated circuits," *IEEE Trans. Nucl. Sci.* (*USA*), Vol. 20, no. 6, p. 293–9, proposes several techniques designed to eliminate latchup in future CMOS applications. Other authors, such as Fang, R. C., et al., "Latchup model for the parasitic p-n-p-n path in bulk CMOS," *IEEE Transactions on Electron Devices*, Vol. ED-31, no. 1, pp. 113–20, provide models of the latchup phenomenon in CMOS circuits in an effort to facilitate design optimizations avoiding latchup.

The present invention takes advantage of the normally undesirable latchup phenomenon in CMOS circuits to construct a compact static memory cell.

SUMMARY OF THE INVENTION

The present invention provides area efficient static memory cells and memory arrays by the use of parasitic bipolar transistors which can be latched in a bistable on state with small area transistors. Each bipolar transistor memory cell includes a gate which is pulse biased during the write operation to latch the cell. These cells can be realized utilizing CMOS technology to create vertical structures in trenches with a minimum of masking steps and minimal process complexity.

DETAILED DESCRIPTION OF THE PREFERRED EMBODIMENT

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention.

The terms wafer or substrate used in the following description include any semiconductor-based structure having an exposed silicon surface in which to form the structure of this invention. Wafer and substrate are to be understood as including doped and undoped semiconductors, epitaxial layers of silicon supported by a base semiconductor foundation, and other semiconductor structures. Furthermore, when reference is made to a wafer or substrate in the following description, previous process steps may have been utilized to form regions/junctions in the base semiconductor structure or foundation. The following detailed description is, therefore, not to be taken in a limiting sense, and the scope of the present invention is defined by the appended claims.

Figure 1:
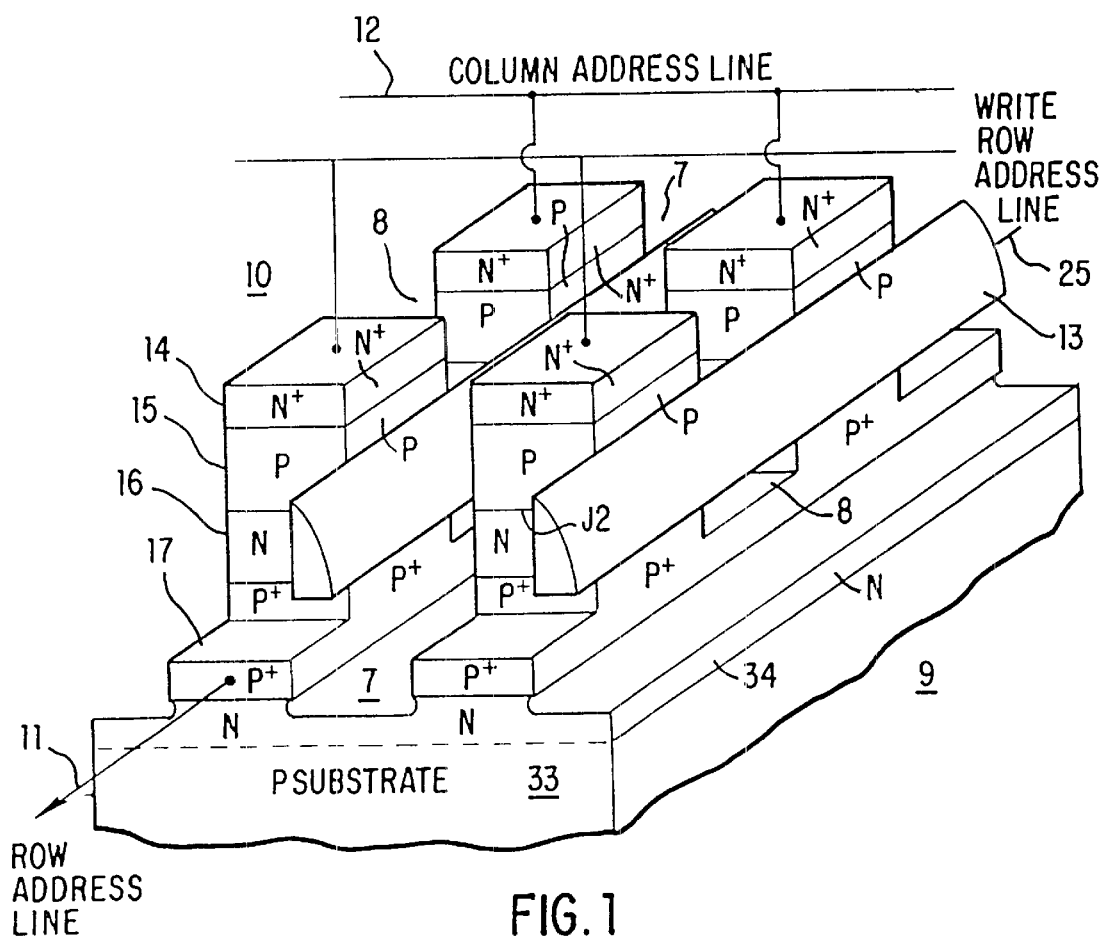
FIG. 1 illustrates one embodiment of a SRAM cell array with latchup and gated diode according to the present invention.

Referring now to the drawings, where like elements are designated by like reference numerals, an embodiment of the SRAM device array 9 of the present invention is shown in FIG. 1. The array 9 is comprised of a plurality of vertical parasitic bipolar transistor pairs on n-type layer 34 on p-type silicon substrate 33. Vertical transistor pairs or devices, noted generally 10, are separated from each other by isolation trenches 7, 8. Each parasitic bipolar transistor device 10 has dimensions of one F by one F, and each isolation trench 7, 8 is preferably one F wide. Thus, with the inclusion of transistor to transistor isolation, the area per programmed device cell is 4 $F^2$ (2 F×2 F).

Figure 2A:
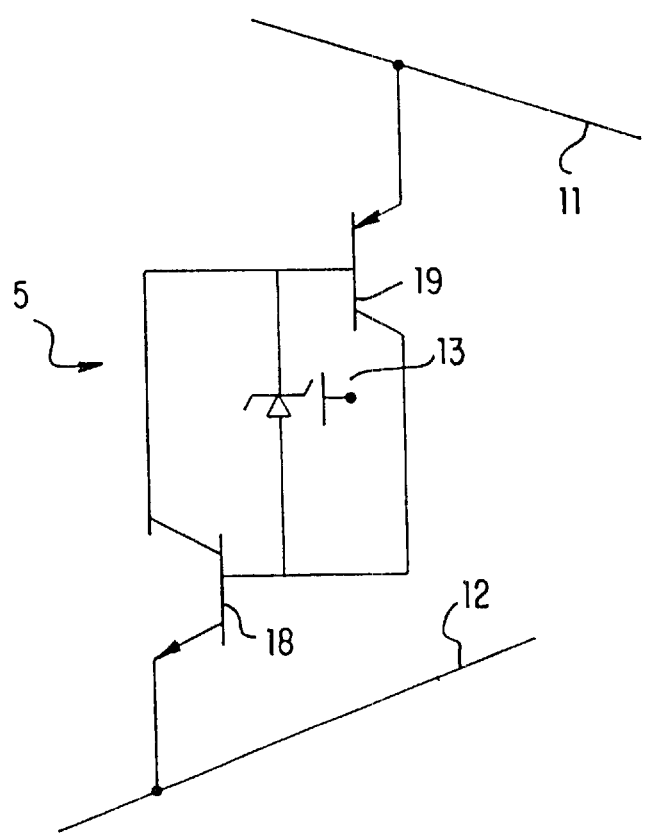
FIG. 2 depicts a SRAM cell with latchup and gated diode and circuit diagrams.
Figures 5A, 5B:
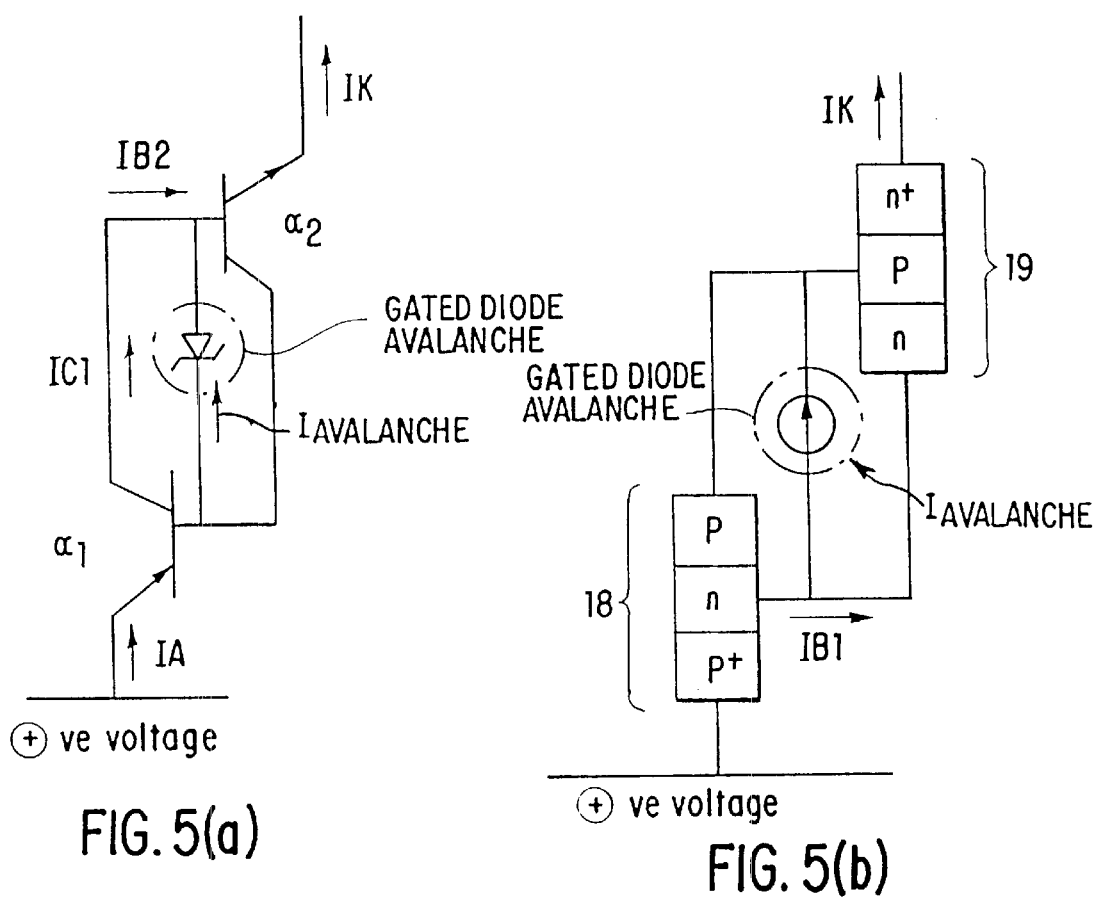
FIG. 5 depicts circuit diagrams for the SRAM cell having gated diode induced latchup of FIG. 2.

Referring to FIG. 2, a static memory cell, generally designated 5, comprises two complementary bipolar transistors which can latch-up, normally an undesirable characteristic in CMOS but utilized here to construct a compact SRAM cell. If vertical structures are used, a 4 $F^2$ cell results as also shown in FIG. 2(d). As shown in FIGS. 2 and 3, p+ region 17, n-region 16, and p-region 15 comprise a p-n-p bipolar transistor 18; and n+ region 14, p-region 15, and n-region 16 comprise an n-p-n bipolar transistor 19. Thus, each parasitic bipolar transistor device 10 can be considered as a p-n-p transistor 18 and an n-p-n transistor 19 connected with the collector of one transistor attached to the base of the other, and vice versa, as shown in FIGS. 3(b) and 5(b). The center junction (J2) acts as a collector of electrons from (J1) and of holes from (J3). In equilibrium, there is at each junction a depletion region with a built-in potential determined by the impurity doping profile. When a positive voltage is applied to the anode, junction (J2) will become reverse-biased, while (J1) and (J3) will be forward biased.

There are three sets of interconnects in the device array 9. Row address line 11 is in connection with lowermost p+ region 17 of each transistor device 10. Column address line 12 is in connection with the uppermost n+ region 14, and write row address line 25 is in connection with gate 13. A high density array is achieved by the use of vertical devices and by placing gate 13 in the isolation trench 7. Gate 13 gates the central p-n junction (J2) of each transistor structure, as shown in FIGS. 1, 2(d) and (f), and runs within isolation trench 7 on one side of each parasitic bipolar transistor device 10.

Figure 2B:
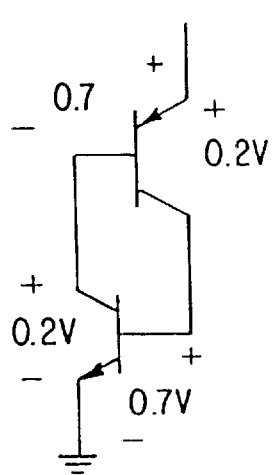
Figure 2C:
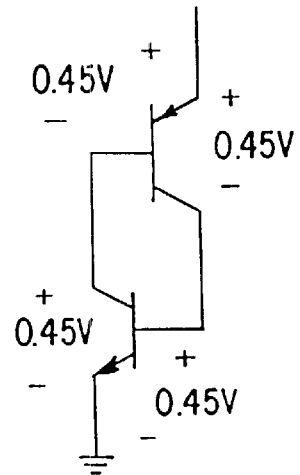

Referring to FIG. 2, showing static memory cell 5, containing gate 13, FIG. 2(b) shows memory cell 5 in the latched condition. FIG. 2(c) shows memory cell 5 in the blocking (not latched) condition. These conditions reflect CMOS latchup action, initiated by gated diode current multiplication and avalanche breakdown from gate 13, as discussed in detail below. Gate 13 induces latchup in the parasitic bipolar transistor device 10, thus creating one of the two bistable states for the static memory cell.

If bipolar transistors 18, 19 are off, then the cell will block and not become latched until the power supply voltage, $V_{DD}$, becomes very high. However, the cell can be induced to latch up at low power supply voltages of a few volts by the application of a pulsed gate bias, thus inducing avalanche multiplication and breakdown in the gated diode structure in the center p-n junction (J2) as shown in FIGS. 3 and 4. Referring to FIG. 3(b), inversion region 20 in central p-type region 15, and depletion region 21 in central n-type region 16, occur when a pulse of negative voltage is applied to gate 13 and result in gated diode avalanche breakdown and current multiplication in region 22.

To turn on the device, it is necessary to introduce an external stimuli, e.g., base current by initiating current multiplication in the gated diode with a pulsed gate bias and higher column voltage. The operation must be designed such that pulsing yields enough current such that the sum of the common base current gains, $\alpha_1$ and $\alpha_2$, of bipolar transistors 18, 19 exceeds one. The bias applied to induce latchup is "pulsed" in the sense that it is only applied to initiate latchup. The cell is stable in the latched condition as a result of the pulse initiated latchup, which occurs during the "write" operation as discussed below.

The collector and base currents ($I_C$ and $I_B$, respectively) and the common base forward current transfer ratios or "current gain" $\alpha_1$ and $\alpha_2$ are shown in FIG. 5(a). From FIG. 5(a), the collector current of the n-p-n transistor 19 provides the base drive for the p-n-p transistor 18. Also, the collector current of the p-n-p transistor 18 supplies the base drive for the n-p-n transistor 19. The base current of p-n-p transistor 18, $I_{B1}$, is given by $$I_{B1} = (1-\alpha_1)I_A$$

which is supplied by the collector of n-p-n transistor 19. The collector current of n-p-n transistor 19 with a common base current gain, $\alpha_2$, is given by $$I_{C2} = \alpha_2 I_K$$

By equating $I_{B1}$ and $I_{C2}$ with $I_{AVALANCHE}$:

$$I_{B1} - I_{AVALANCHE} = I_{C2}$$

Since $I_A = I_K$, when the collector-base reverse saturation currents approach zero (neglecting leakage), then:

$$I_A = \frac{I_{AVALANCHE}}{1-(\alpha_1+\alpha_2)}$$

which gives the static characteristic of the device up to the breakdown voltage. $I_{AVALANCHE}$ is small, so $I_A$ is small, unless $(\alpha_1+\alpha_2)$ approaches unity; at this point, the denominator of the equation approaches zero, and latch up will occur.

Figure 3A:
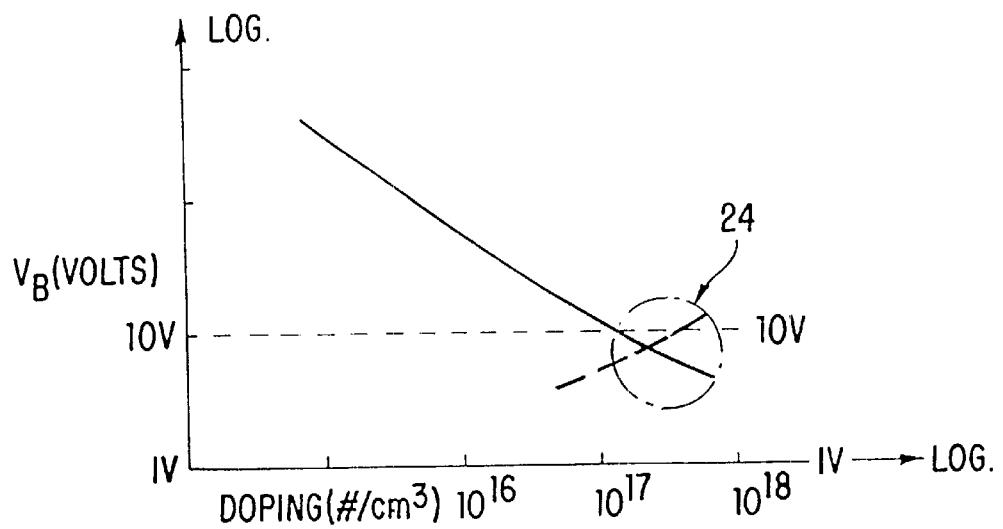
FIG. 3 illustrates current-voltage characteristics and avalanche multiplication in the gated diode structure of the SRAM cell of FIG. 2.
Figure 3B:
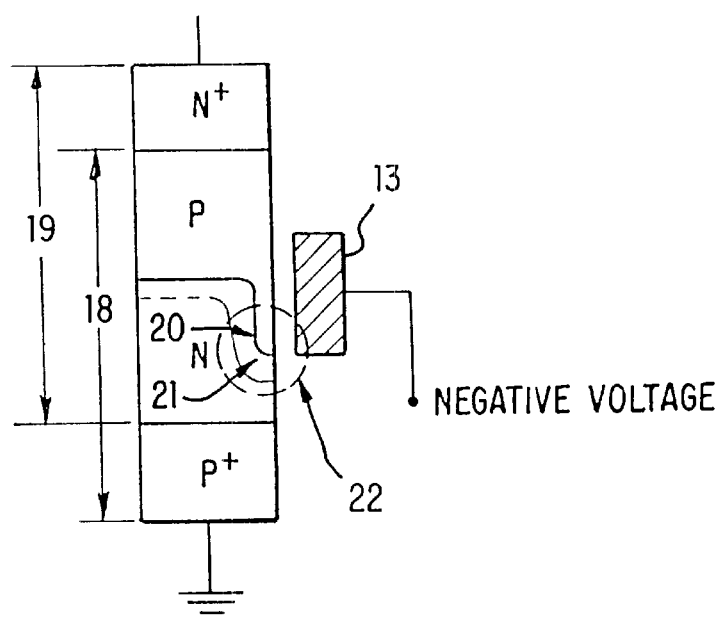
Figure 4:
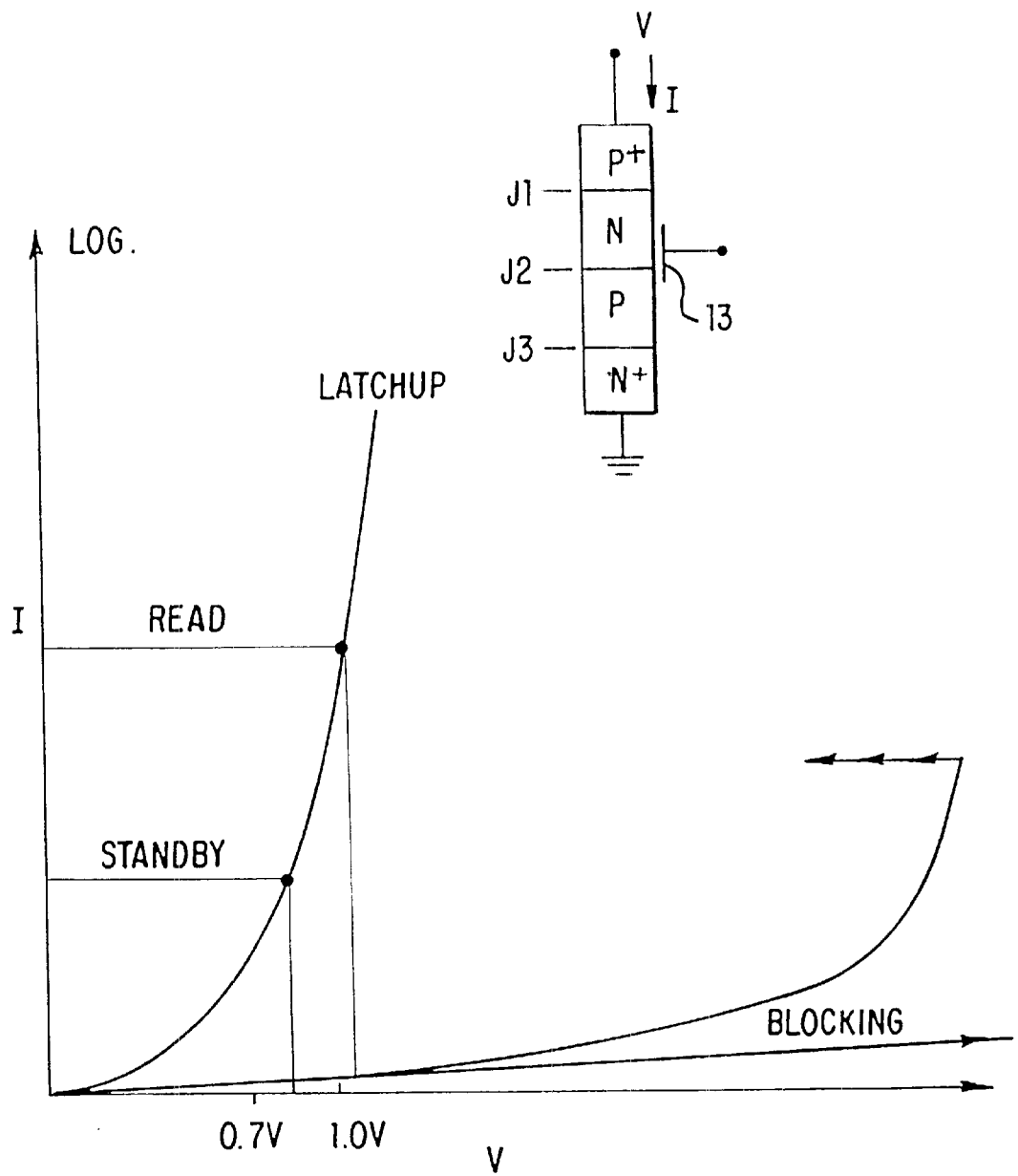
FIG. 4 depicts the blocking, write and latchup states of the SRAM cell of FIG. 2.

An illustration of the current multiplication and breakdown voltages required in the gated diode is given in FIG. 3(a). Diode dopings of over $10^{18}/cm^3$ will result in breakdown voltages ($V_B$) of only a few volts. Region 24 in FIG. 3(a) shows where avalanche multiplication and breakdown (due to tunneling) occur, in terms of voltage $V_B$ and dopant concentration in the p-n-p-n parasitic bipolar transistor device 10. The preferred dopant concentration for the central p-n diode is above $10^{17}$ atoms per $cm^3$, with concentrations equal to or above $10^{18}$ atoms per $cm^3$ being most preferred.

Figure 6A:
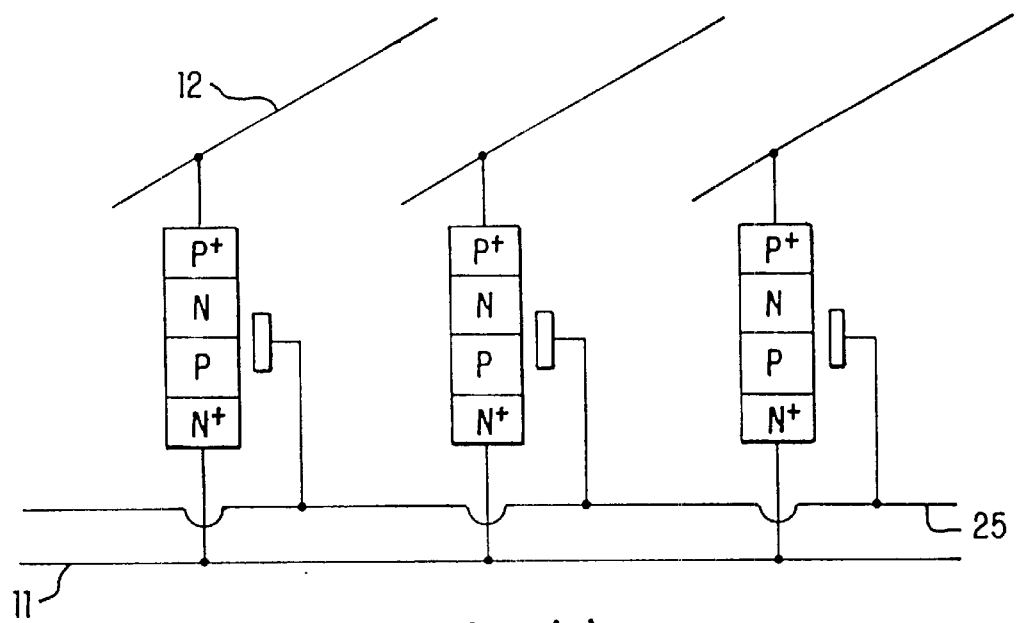
FIG. 6 illustrates a SRAM cell array with interconnect circuitry.
Figure 6B:
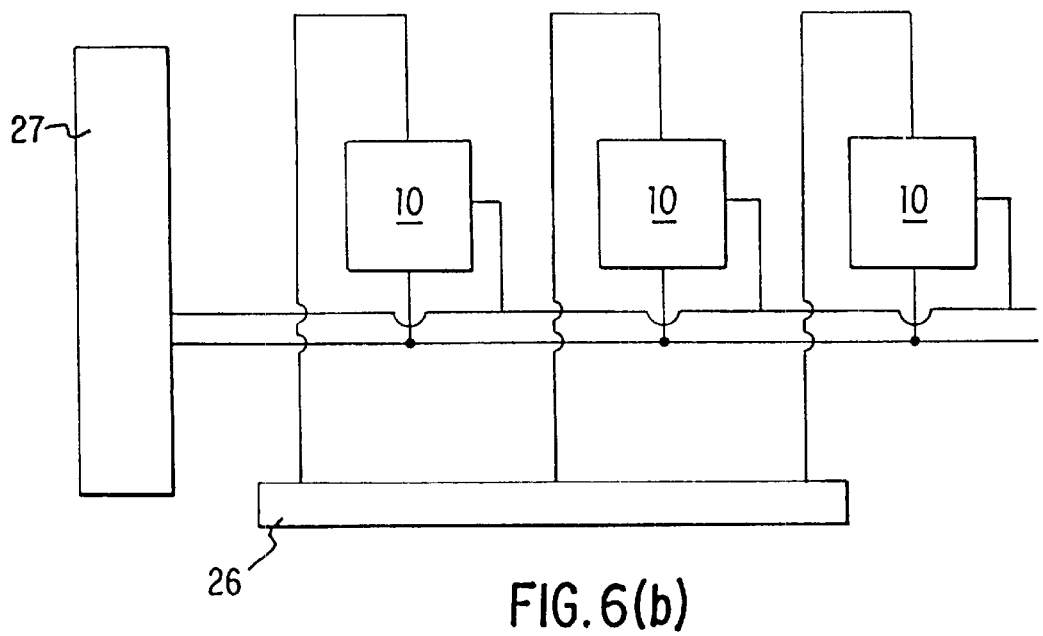

Referring now to FIG. 6, the array structure of the CMOS SRAM includes column decoder 26 and row decoder 27. Data can be read most conveniently by addressing a row and a column and increasing the power supply voltage across device 10 to 0.9 V or more at the coincidence of the address. If the cell is latched up, a large current will be sensed between these row and column lines. If not latched, there will be little extra current. When the cell is not addressed, it can be left in some low voltage state with $V_{DD}$ around 0.7 V to 0.8 V to reduce power consumption. Read can be accomplished by lowering the row address voltage.

Write can be accomplished by a coincidence of address in the polysilicon gate lines 25 and high column address voltages, to induce carrier multiplication in the gated diode and turn the transistors on strongly. Writing "one" or turning the transistors on and latching up the cell can be achieved when the cell is in a higher $V_{DD}$ voltage state.

It is most convenient to "write" a row or word as one operation. To do so, the row voltage comes positive to leave some very low value like 0.4 V or less across transistors in the row to turn off any transistors which are latched up, thus writing "zero" in all cells along the row or word line. Sufficient time is then allowed for any excess base charge in the latched-up cells to recombine. Following this; "ones" are written into selected locations along the word line by a coincidence of row gate line address and selected high column voltages.

In 0.2 micron technology, at moderate forward bias during the read operation, transistor devices 10 will provide about 100 µA of current. If this is read in 1.6 nanoseconds, then the total signal will be one million electrons, which is comparable to the read signal in DRAMs and easily sensed above any noise. A 4 $F^2$ cell will result in an area of less than 1 $cm^2$ for a 128 Mbit SRAM in 0.2 micron technology. If the standby current in each cell is 10 nanoamperes, then the standby current will be 1.28 A and the power dissipation about 1 Watt or 1 Watt/$cm^2$, which is easily dissipated. A ratio of read current to standby current of 100 µA/0.01 µA can be achieved since the read current is an exponential function of voltage, as shown in FIG. 4. These considerations can readily be scaled to other size, or minimum feature size, dimensions.

Figure 7:
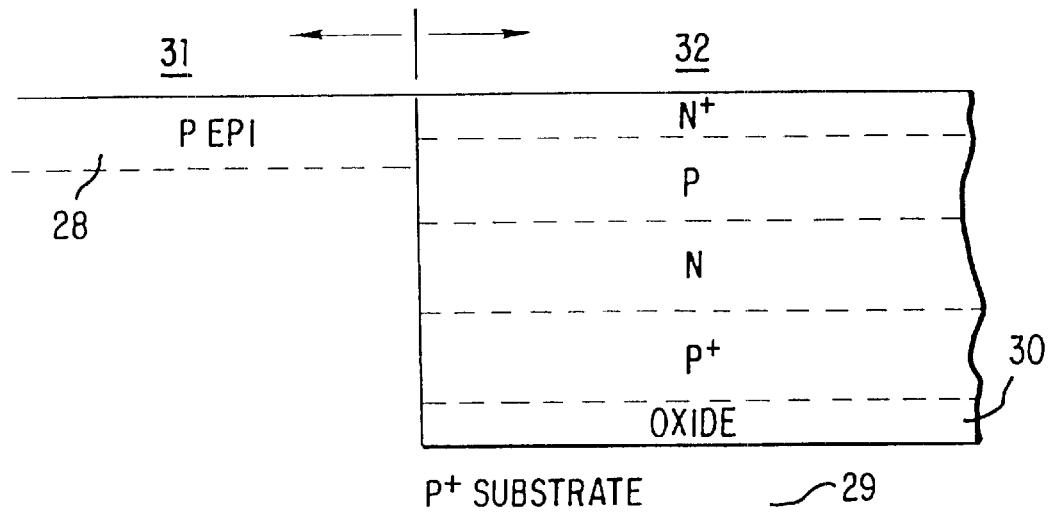
FIG. 7 shows an in-process wafer for producing a SRAM cell array using oxide isolation on a p+ substrate.
Figure 8:
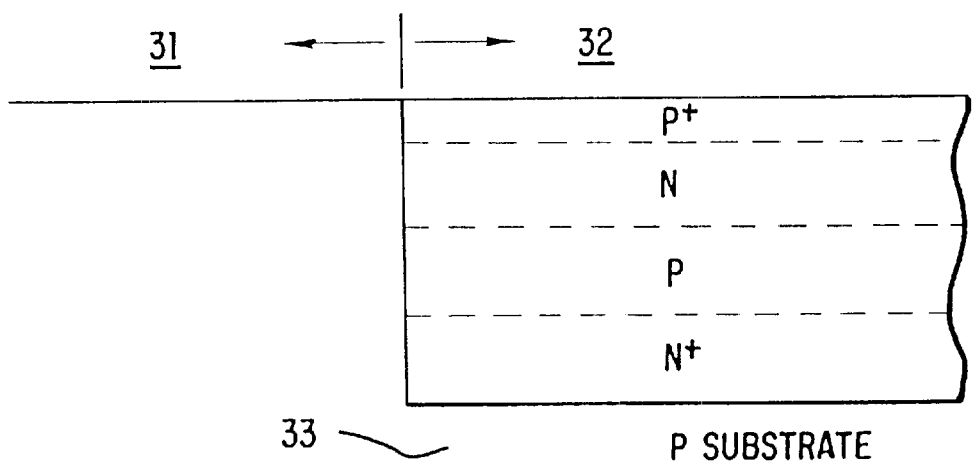
FIG. 8 shows an in-process wafer for producing a SRAM cell array using an isolated inverted structure on a p-type substrate.
Figure 9:
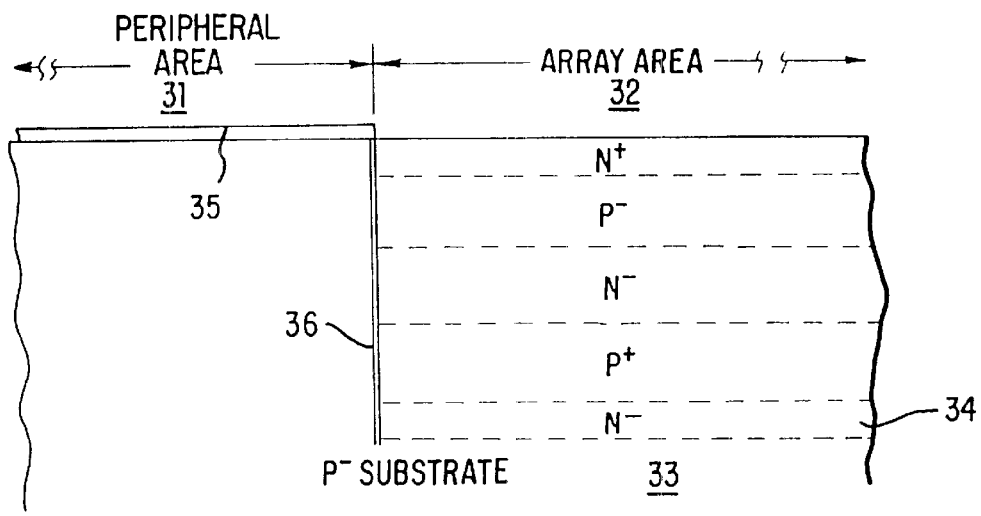
FIG. 9 shows an in-process wafer for producing a non-inverted SRAM cell array using an additional n-type layer to achieve isolation on a p-type substrate.

If planar CMOS peripheral circuits are to be used, the substrate array and peripheral circuit doping profiles must be separated. The exact realization depends on the type of substrate to be used and the technology used to isolate the array structures from the substrate. FIG. 7 illustrates peripheral area 31, array area 32, epitaxial p-layers 28 (EPI) on p+ substrate 29, and oxide isolation layer 30 undercutting the p+ columns in the array area. FIG. 8 illustrates the use of a p-type substrate 33 and inversion of the array structure to achieve junction isolation. FIG. 9 illustrates an array structure which is not inverted, but an additional n-type layer 34 is used to achieve junction isolation on p-type substrate 33. The preferred embodiment described in detail below relates to this latter structure, but the techniques described are also applicable to other structures.

The device array is manufactured through a process described as following, and illustrated by FIGS. 9 through 11 and FIG. 1. First, a silicon substrate 33 is selected as the base for the device array. The silicon substrate 33 may be doped or undoped, but a doped p-type wafer is preferred. Next, an oxide pad layer 35 is grown or deposited on top of the silicon substrate 33 by means of, for example, thermal oxidation of the silicon substrate 33.

A resist (not shown) and mask (not shown) are applied to cover peripheral circuit area 31 and expose array area 32, and photolitographic techniques are used to define the array area 32 to be etched out.

An etchant is then applied to define an array window in the oxide pad 35. After removing the resist, the remaining oxide pad 35 is then used as a mask to directionally etch the silicon substrate 33 to a depth of preferably about 1 µm. Any suitable directional etching process may be used, including, for example, Reactive Ion Etching (RIE), to form an array trench in array area 32 of substrate 33.

An oxide layer 36 is then grown or deposited to cover the bare silicon 33. Oxide layer 36 is then directionally etched to remove oxide from the trench bottom, while leaving oxide layer 36 on the vertical side walls of the array trench. Selective epitaxial silicon is then grown in the array trench in the following preferred doping profile: 0.1 µm n−, 0.3 µm p+, 0.2 µm n−, 0.2 µm p−, 0.2 µm n+, resulting in the cross section as shown in FIG. 9.

Oxide pad 35 is then stripped from the surface of the peripheral area 31. An oxide pad (not shown) of about 10 nm is then grown atop the exposed n+ epitaxial silicon layer in the array area. Next, a nitride pad 37 is formed by depositing a layer of silicon nitride ($Si_3N_4$) ("nitride") by CVD or other means, on top of the pad oxide. The nitride pad 37 is preferably about 60–100 nm thick.

The next step is to define a first set of trenches 8 of the minimum dimension width and space in the column direction. A resist (not shown) and mask (not shown) are applied, and photolithographic techniques are used to define the area to be etched-out. A directional etching process such as RIE is used to etch through the pad layers 35 and 37 and into the silicon to a depth sufficient to expose the buried p+ layer (i.e., below junction 3 (J3)). The resist is then removed. The set of trenches 8 is defined by the sidewalls of the p-n-p-n epitaxial layers. The trenches are then filled with silicon oxide by CVD and the surface is planarized by CMP, stopping on the nitride pad 37.

Figure 10:
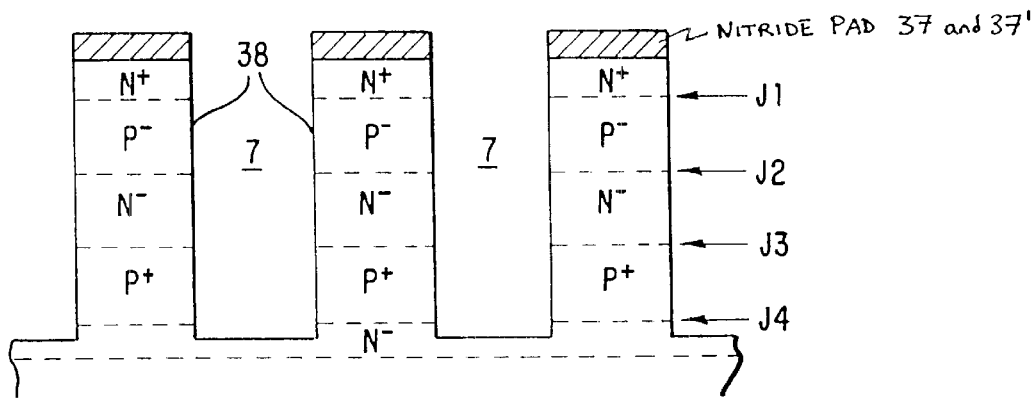
FIG. 10 shows the wafer of FIG. 9 at a processing step subsequent to that shown in FIG. 9.

A second nitride pad layer 37' is then applied, preferably by CVD, to a thickness of about 100 nm. Photolithography is used to define a second set of trenches 7 orthogonal to the first set of trenches 8. Resist and mask are applied to define the minimum dimension width and space stripes in the row direction. The nitride pad layer and the array layer are etched out by a directional etching process such as RIE to form sidewalls 38 orthogonal to the sidewalls which define the first set of trenches 8. After etching through the nitride pad to expose alternate silicon and oxide regions, either a simultaneous silicon/oxide etchant or a sequential etch of oxide and silicon may be used to form trenches 7 of uniform depth in the row direction and of sufficient depth to expose the bottom n-layer as shown in FIG. 10. Etching is continued down to the level of the n-layer below junction 4 (J4), and then the resist is removed.

Figure 11:
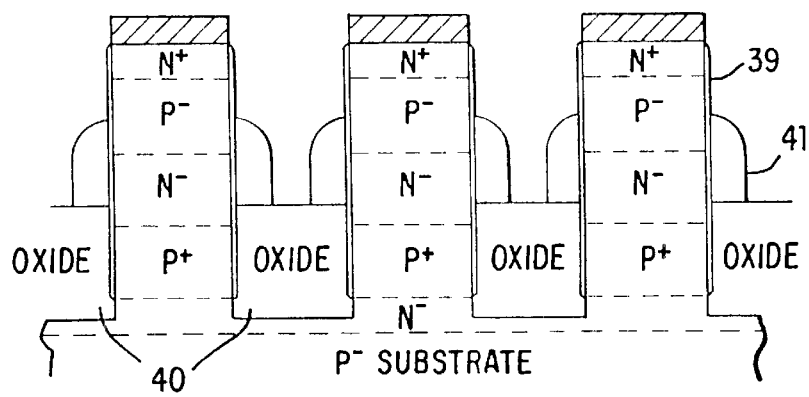
FIG. 11 shows the wafer of FIG. 9 at a processing step subsequent to that shown in FIG. 10.

Oxide layer 40 is then deposited to fill the trenches up to n-type layer (i.e., above J2). Oxide 40 may be planarized by CMP and is preferably deposited by CVD, and may then be etched back to below J2, as shown in FIG. 11.

A thin gate oxide 39 is then grown on trench walls 38. A p+ polysilicon layer 41 is then formed by deposition of doped polysilicon, preferably by CVD. The thickness of the p+ polysilicon layer 41 is preferable less than or equal to about one-third the minimum lithographic dimension.

Referring now to FIG. 1, the next step is to remove excess polysilicon by directional etching of exposed portions of the polysilicon layer 41 so that the layer is recessed below the level of junction 1 (J1). Resist and mask are applied to cover alternate trench walls. Polysilicon layer 41 is etched to remove exposed polysilicon and leave remaining polysilicon as gates 13 on one sidewall of each trench as shown in FIG. 1.

The device array then undergoes a finishing process. Trenches 7 are filled with silicon oxide and the surface of the device array is planarized, by CVD and CMP, respectively, or other suitable processes. Conventional processing methods may then be used to form contact holes and metal wiring to connect gate lines and to equip the device array for peripheral circuits. The final structure of the device array is as shown in FIG. 1.

The process sequence described and illustrated above provides for the formation of minimum dimension programmable devices. It follows that other structures may also be fabricated, different methods of isolating the bipolar transistors, and different methods of forming the p-n-p-n diodes, such as single dopant and implant techniques, may be realized, by process integration with common process steps.

The above description and drawings illustrate preferred embodiments which achieve the objects, features and advantages of the present invention. It is not intended that the present invention be limited to the illustrated embodiments. Any modification of the present invention which comes within the spirit and scope of the following claims should be considered part of the present invention.

What is claimed as new and desired to be protected by Letters Patent of the United States is:

1. A method of forming a memory cell for storing information as one of at least two possible bistable current states, the method comprising the following steps:

providing a semiconductor substrate;
   providing doped silicon regions in the following doping profile: p, n, p and n, to form a vertical p-n-p-n diode;
   forming a p+ polysilicon gate adjacent to the central n-p region of said diode; and
   providing no more than a first and a second electrical interconnect to said diode in addition to said p+ polysilicon gate.

2. The method of claim 1 wherein said substrate is a p-type substrate and said method further comprises the step of forming an insulating material layer between the p-n-p-n diode and the substrate.

3. The method of claim 1, wherein the act of forming said p+ polysilicon gate further comprises:

defining a first set of trenches in said doped silicon regions to a depth at least sufficient to expose the lowermost buried p-type layer;
   defining a second set of trenches orthogonal to said first set of trenches to a depth at least sufficient to expose the lowermost buried p-type layer;
   forming a gate oxide layer on the sidewalls of said first set of trenches; and
   defining a p-type polysilicon gate within one of said trenches and adjacent to the central n and p regions of said doped silicon.

4. The semiconductor processing method of claim 3, wherein the act of defining said p-type polysilicon gate further comprises:

depositing a p-type polysilicon layer in the first set of trenches;
   removing a portion of said polysilicon layer while leaving remaining polysilicon as gate material on one sidewall of each trench of said first set of trenches.

5. The method of claim 1 wherein said p-n-p-n diode is inverted.

6. A semiconductor processing method of forming CMOS static access memory within a semiconductor substrate, the method comprising the following steps:

providing a semiconductor substrate;
   defining an array trench within said substrate;
   providing doped silicon regions in said trench in the following doping profile: p, n, p and n;
   defining a first set of trenches in said doped silicon by directional etching to a depth at least sufficient to expose the buried p-type layer, said first set of trenches being no more than about 1 F wide and spaced no more than about 1 F apart, where F is the minimum feature size;
   defining a second set of trenches orthogonal to said first set of trenches by directional etching to a depth at least sufficient to expose the buried p-type layer, said second sect of trenches being no more than about 1 F wide and spaced no more than about 1 F apart;
   forming a gate oxide layer on sidewalls of said first set of trenches; and
   defining a p-type polysilicon gate within one of said trenches and adjacent to the central n and p regions of said doped silicon.

7. The semiconductor processing method of claim 6, wherein the act of defining a p-type polysilicon gate further comprises:

depositing a p-type polysilicon layer in the first set of trenches; and
   removing a portion of said polysilicon layer, while leaving remaining polysilicon as gate material on one sidewall of each trench of said first set of trenches.

8. The method of claim 7, further comprising the steps of depositing oxide to fill the first and second sets of trenches up to past the bottom of the lowermost n-type layer.

9. The method of claim 6 wherein said substrate is a p-type substrate.

10. The method of claim 9 wherein said doping profile is n−, p+, n−, p− and n+.

11. The method of claim 9 wherein said doping profile is inverted.

12. The method of claim 9 further comprising the step of undercutting said p-type layer to form an evacuated region and filling said evacuated region with an insulting material.

13. A semiconductor processing method of forming CMOS static access memory within a semiconductor substrate, the method comprising the following steps:

providing a semiconductor p-type substrate;

defining an array trench within said substrate;

providing doped silicon in said trench in the following doping profile: n, p, n, p and n; and n;

defining a first set of trenches in said doped silicon by directional etching to a depth at least sufficient to expose the buried lowermost p-type layer, said first set of trenches being no more than about 1 F wide and spaced no more than about 1 F apart, where F is the minimum feature size;

defining a second set of trenches orthogonal to said first set of trenches by directional etching to a depth at least sufficient to expose the buried n-type layer, said second set of trenches being no more than about 1 F wide and spaced no more than about 1 F apart;

forming a gate oxide layer on sidewalls of said second set of trenches;

depositing oxide to fill the first and second sets of trenches up to past the bottom of the lowermost n-type layer;

depositing a p-type polysilicon layer within the second set of trenches; and removing said polysilicon layer, while leaving remaining polysilicon as gate material on one sidewall of each trench of said second set of trenches.

14. A method of forming a circuit for storing information as one of at least two possible stable current states, the method comprising the following steps:

providing a semiconductor substrate;

providing doped silicon regions to form a multi-region vertical thyristor having at least four regions;

forming at least one polysilicon gate overlying a junction of said multi-region vertical thyristor;

connecting said at least one polysilicon gate to a voltage source for producing latch-up in said multi-region vertical thyristor; and providing no more than a first and a second electrical interconnect to said thyristor in addition to said polysilicon gate.

15. The method of claim 14 wherein said step of providing doped silicon regions further comprises forming one memory cell.

16. The method of claim 14, wherein said first electrical interconnect is a column address line in electrical contact with a first end of said thyristor and said second electrical interconnect is a row address line in electrical contact with a second end of said thyristor opposite to said first end.

17. The method of claim 1, wherein said first electrical interconnect is a column address line in electrical contact with a first end of said diode and said second electrical interconnect is a row address line in electrical contact with a second end of said diode opposite to said first end.

* * * * *

UNITED STATES PATENT AND TRADEMARK OFFICE
CERTIFICATE OF CORRECTION

PATENT NO. : 6,503,790 B2
DATED : January 7, 2003
INVENTOR(S) : Wendell P. Noble et al.

It is certified that error appears in the above-identified patent and that said Letters Patent is hereby corrected as shown below:

<u>Title page,</u>
Item [56], References Cited, OTHER PUBLICATIONS, "D. L. Hetherington" reference, "Thyristor/JET" should read -- Thyristor/JFET --

<u>Column 9,</u>
Line 20, "n; and n;" should read -- n; --

Signed and Sealed this

Twentieth Day of April, 2004

JON W. DUDAS
*Acting Director of the United States Patent and Trademark Office*